(12) United States Patent
Wang et al.

(10) Patent No.: US 8,174,090 B2
(45) Date of Patent: May 8, 2012

(54) PACKAGING STRUCTURE

(75) Inventors: Zhiqi Wang, Jiang Su Province (CN);
Guoqing Yu, Jiang Su Province (CN);
Qiuhong Zou, Jiang Su Province (CN);
Youjun Wang, Jiang Su Province (CN);
Wei Wang, Jiang Su Province (CN)

(73) Assignee: China Wafer Level CSP Ltd., Jiang Su Province (CN)

( * ) Notice: Subject to any disclaimer, the term of this patent is extended or adjusted under 35 U.S.C. 154(b) by 286 days.

(21) Appl. No.: 12/434,199

(22) Filed: May 1, 2009

(65) Prior Publication Data

US 2010/0133640 A1    Jun. 3, 2010

(30) Foreign Application Priority Data

Dec. 3, 2008    (CN) .......................... 2008 1 0178977

(51) Int. Cl.
*H01L 31/00*    (2006.01)
(52) U.S. Cl. ........................................ 257/459; 438/613
(58) Field of Classification Search .................. 257/459, 257/E21.589, E31.124; 438/613
See application file for complete search history.

(56) References Cited

U.S. PATENT DOCUMENTS

| | | | |
|---|---|---|---|
| 7,633,133 B2 * | 12/2009 | Noma et al. ................... | 257/434 |
| 7,884,392 B2 * | 2/2011 | Lee et al. ....................... | 257/184 |
| 2005/0006732 A1 * | 1/2005 | Perillat .......................... | 257/666 |
| 2007/0069320 A1 * | 3/2007 | Lee et al. ....................... | 257/459 |
| 2010/0244241 A1 * | 9/2010 | Marimuthu et al. ........... | 257/737 |

FOREIGN PATENT DOCUMENTS

JP    2005311117 A    11/2005

OTHER PUBLICATIONS

Chinese Office Action dated Jul. 24, 2009 from corresponding Chinese application No. 200810178977.7.

\* cited by examiner

*Primary Examiner* — Phuc Dang
(74) *Attorney, Agent, or Firm* — Wolf, Greenfield & Sacks, P.C.

(57) ABSTRACT

The invention discloses a packaging structure and packaging method. The packaging structure includes a solder bump, a pad located on a front side of a chip, and an intermediate metal layer which connects the solder bump and the pad, wherein a through hole passing from a back side of the chip to the pad is provided on the chip, and the intermediate metal layer is connected to the pad within the through hole. In the packaging structure, a through hole is formed on the back side of the chip to expose the pad on the front side of the chip and the intermediate metal layer is connected to the pad within the through hole. This provides a relatively large contacting area therebetween. The connection thus formed is more reliable and stable, compared with the prior art structure.

8 Claims, 5 Drawing Sheets

PACKAGING STRUCTURE

CROSS REFERENCES OF RELATED APPLICATION

The application claims priority to the Chinese patent application No. 200810178977.7 filed on Dec. 3, 2008 and entitled "WAFER LEVEL CHIP SIZE PACKAGING METHOD AND PACKAGING STRUCTURE", the contents of which are incorporated herein by reference in its entirety.

FIELD OF THE INVENTION

The invention relates generally to the manufacturing of semiconductor devices, and particularly to a packaging method and packaging structure.

BACKGROUND OF THE INVENTION

Wafer Level Chip Size Packaging (WLCSP) technology is a technology in which a whole wafer is packaged and tested before being diced into individual chips. Such a technology is totally different from the conventional packaging technologies, such as Chip On Board (COB), where a whole wafer is thinned and diced into individual chips and then the chips are wire bonded. The size of a chip after being packaged with the WLCSP technology is almost the same as that of a bare chip. The WLCSP technology satisfies the requirements for the microelectronic products, such as light weight, small size (especially in length and thickness) and low cost. A chip packaged with the WLCSP technology realizes its miniaturization, and the cost of the chip is reduced significantly with the decrease in chip size and the increase in wafer size. The WLCSP technology, as a technology that takes into account the IC design, wafer fabrication, packaging test and substrate fabrication as a combination, is a focus in the packaging field and represents a trend of the packaging technologies.

In the WLCSP technology, the pads arranged in the exterior of a semiconductor chip are generally re-distributed, by a re-distribution process, to form an area array of a number of metal bonding balls which are sometimes referred to as solder bumps. The WLCSP technology, due to its process of packaging and testing a whole wafer prior to the dicing, presents the following advantages: first, compared with the conventional art in which the wafer is diced and classified before being packaged, the processes are significantly optimized by directly entering the wafer into the packaging process; in addition, different from the conventional assembly process, all integrated circuits are packaged at one time, the marking process is performed on the wafer directly, and the packaging and testing are done at one time, therefore, the manufacturing time and cost are reduced significantly.

Shellcase Ltd. Israel developed its advanced WLCSP technology, classified ShellOP, ShellOC, and ShellUT, which provide perfect solutions for the packaging of image sensors. Unlike other packaging methods, the Shellcase process requires no lead frames or wire bonding. Briefly, ShellOP utilizes a glass/silicon/glass sandwich structure to enable image-sensing capabilities and to protect the image sensors from being contaminated by external environment. ShellOC adopts the same sandwich structure, but extra cavities are configured on the first glass by spin coating photosensitive epoxy and then exposing and developing it. The extra cavities accommodate the image sensor and micro-lenses thereon for enhancing image quality. ShellOC is thus the packaging solution of choice for image sensors with micro-lenses. In the ShellUT package, cavities are still kept but a second glass is removed so that the associated package height is reduced.

US patent application No. US2001018236, which is assigned to Shellcase Ltd., discloses a packaging structure and a method for forming the packaging structure that are based on the WLCSP technology. As shown in FIG. 1, the disclosed packaging structure includes a substrate 114, a cavity wall 116 on the substrate 114, pads 112, a chip 102 including a photosensitive element 101, and bumps 110. The cavity wall 116 on the substrate 114 is sealed, via the pads 112, over a first surface of the chip 102 to define a cavity 120. An epoxy layer 104 is formed over the other surface of the chip 102, and the other surface of the epoxy layer 104 is covered by a glass layer 106, along the edge of which an intermediate metal layer 108 is formed. The intermediate metal layer 108 is electrically connected to the pads 112 and the bumps 110.

As shown in FIG. 1, T shaped connection points are formed between the pads 112 and the intermediate metal layer 108. Such shaped connection is not reliable since it is prone to break under extreme situations. In addition, the packaging structures formed with the above packaging methods are still too thick to comply with the miniaturization trend of semiconductor devices.

In addition, in the existing technologies the pads on a chip may extend outside to form extension pads so as to enlarge the area of the pads, thereby enhancing the stability of the bonding. However, this results in a reduction in the available area on the wafer for manufacturing the chips. Accordingly, the manufacturing cost is increased. Therefore, there is a demand in the industry for the improvement of the above described packaging structures.

SUMMARY OF THE INVENTION

A problem to be solved by the invention is how to improve the stability of a packaging structure and the availability of a wafer while decreasing the thickness of the packaging structure.

According to an aspect of the invention, there is provided a packaging structure which includes a solder bump, a pad located on a front side of a chip, and an intermediate metal layer which connects the solder bump and the pad, wherein a through hole passing from a back side of the chip to the pad is provided on the chip, and the intermediate metal layer is connected to the pad within the through hole.

Optionally, the through hole may be filled with water-soluble sealing paint for electroplating.

Optionally, the water-soluble sealing paint for electroplating may be formed by epoxide polymer or acrylic acid.

Optionally, a protection layer may be formed on a side of the chip which is distant from the intermediate metal layer.

Optionally, the chip may be an optical sensor chip.

Optionally, the optical sensor chip may be provided on the front side of the chip.

Optionally, a circuit pattern may be formed on the intermediate metal layer.

Optionally, an insulation layer may be provided between the intermediate metal layer and the chip.

Optionally, the solder bump may be provided on the back side of the chip.

According to another aspect of the invention, there is provided a packaging method which includes: etching a back side of a chip until a pad located on a front side of the chip is exposed, to form a through hole; forming an intermediate metal layer on the back side of the chip and within the through hole, the intermediate metal layer being connected to the pad within the through hole; and forming a solder bump which is connected with the intermediate metal layer.

Optionally, the method may further include: patterning the intermediate metal layer.

Optionally, before the step of patterning the intermediate metal layer, the method may further include: forming an insulation layer over the back side of the chip and on a side wall of the through hole.

Optionally, the solder bump may be formed on the back side of the chip.

Optionally, before the step of forming the solder bump, the method may further include: forming on the back side of the chip a mask exposing the through hole; and plating within the through hole with a water-soluble sealing paint for electroplating to fill the through hole.

Optionally, the water-soluble sealing paint may include epoxide polymer or acrylic acid.

Optionally, before the step of forming the solder bump, the method may further include: forming a protection layer on a surface of the intermediate metal layer, wherein an opening for exposing the intermediate metal layer is provided at a position on the protection layer predefined for forming the solder bump.

Optionally, the chip may be an optical sensor chip.

Optionally, the optical sensor chip may be provided on the front side of the chip.

In the packaging structure according to the embodiments of the invention, a through hole is formed on the back side of the chip to expose the pad on the front side of the chip and the intermediate metal layer is connected to the pad within the through hole, thereby providing a relatively large contacting area. The connection thus formed is more reliable and stable.

DETAILED DESCRIPTION OF THE EMBODIMENTS

Embodiments of the application provide a packaging structure and a corresponding packaging method, by which the connection area between an intermediate metal layer and a pad may be increased and thus a more stable connection structure may be formed.

Some embodiments of the invention will be described below with reference to the accompany drawings, taking the packaging of an optical sensor chip as an example.

Figure 1:
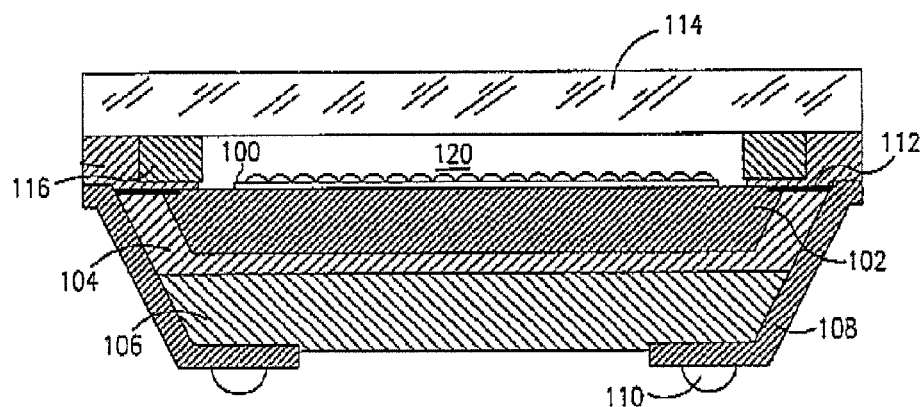
FIG. 1 is a schematic diagram illustrating a packaging structure in the prior art.
Figure 2:
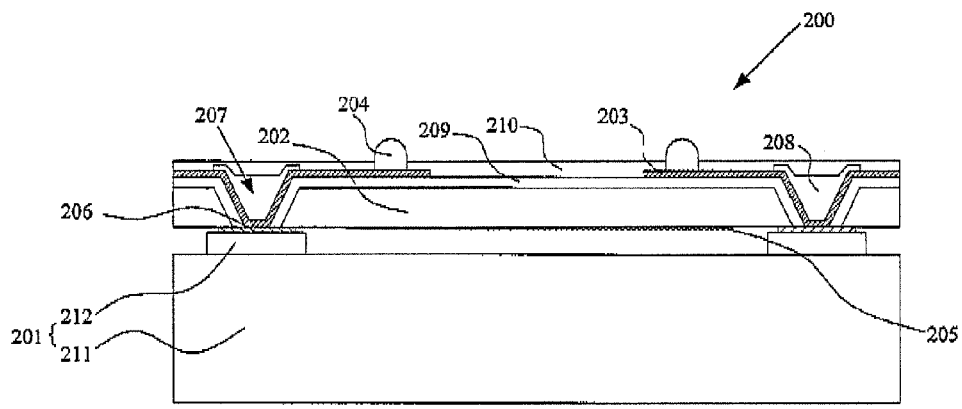
FIG. 2 is a schematic diagram illustrating the structure of a packaging structure according to an embodiment of the invention.

FIG. 2 illustrates a packaging structure according to an embodiment of the invention. As shown in FIG. 2, the packaging structure 200 includes a substrate structure 201, a chip 202 bonded to the substrate structure 201, an intermediate metal layer 203 and a solder bump 204. The chip 202 has two sides, i.e. a front side and a back side. An optical sensor 205 and a pad 206 located in the exterior area of the optical sensor 205 are provided on the front side of the chip 202. The pad 206 serves as the point connecting the internal circuit of the chip 202 with the circuits outside the chip 202. A through hole 207 passing from the back side of the chip 202 to the pad 206 may also be provided on the chip 202. The intermediate metal layer 203 is connected to the pad 206 within the corresponding through hole 207. The intermediate metal layer totally covers the pad 206 exposed within the corresponding through hole 207, thereby forming the connection between the intermediate metal layer 203 and the pad 206. In this way, the contacting area between the metal layer 203 and the pad 206 is relatively large, and thus the connection structure therebetween may be more reliable, thereby avoiding the defect of the T-shaped connection in the prior art which is unstable or unreliable due to small contacting area.

In an embodiment of the invention, the through hole 207 may be filled with a through hole plug 208 which may be formed by water-soluble sealing paint for electroplating, to protect the intermediate metal layer 203 within the through hole 207. The water-soluble sealing paint for electroplating may include epoxide polymer or acrylic acid. The through hole plug 208, which fills the through hole 207, is formed by plating the through hole 207 with the water-soluble sealing paint for electroplating. The plating method may prevent the formation of voids which are prone to occur when using the depositing method. Thus, the stability of the packaging structure may be improved.

In another embodiment of the invention, the solder bump 204 may be provided on the portion of the intermediate metal layer 203 located on the back side of the chip 202, an end of the intermediate metal layer 203 directly contacts the base portion of the solder bump 204, thereby forming the electrical path from the solder bump 204 to the corresponding pad 206.

In the embodiments of the invention the pad 206 may be an existing pad on the chip 202, without forming any extension pads as disclosed in the prior art. Therefore, the availability of the wafer may be increased significantly. In other words, more chips may be formed on a single wafer.

As can be recognized by a person of ordinary skill in the art, a packaging structure may include one or more solder bumps 204 and one or more pads 206 corresponding thereto. In an embodiment of the present invention there may be a plurality of solder bumps 204 and a plurality of pads 206 corresponding thereto. In this case, the intermediate metal layer 203 is required to have a certain pattern, so as to form separated electrical path between each solder bump 204 and the corresponding pad 206. The circuit pattern of the intermediate metal layer 203 may be formed by some process such as etching.

Since conductivity is the most important property of the intermediate metal layer 203, the intermediate metal layer 203 may be made of a metal such as aluminum, Al—Ni alloy or gold. According to the requirements of the packaging, the intermediate metal layer 203 may optionally be transparent. In this case, the intermediate metal layer 203 may be made of Nano Indium Tin Oxides (ITO) which is not only electrically conductive but also transparent.

Since the body of the chip 202 is a substrate made of semiconductor silicon material, it is necessary to form insulation between the chip 202 and the intermediate metal layer 203 so as to avoid current leakage or other cases that may impact the accuracy of signal transmission of the intermediate metal layer 203. In view of this, an insulation layer 209 is provided between the intermediate metal layer 203, and the back side of the chip 202 and the side wall of the through hole 207. The insulation layer 209 may be made of epoxide polymer or acrylic acid.

A protection layer 210 may be further provided on the intermediate metal layer 203 to protect the intermediate metal layer 203. The protection layer 210 may totally cover the intermediate metal layer 203 and the through hole plug 208, except that a through hole (not shown) may be formed at the location where the intermediate metal layer 203 contacts the solder bump 204. The diameter of the through hole equals to or substantially equals to the radical diameter of the solder bump 204, so that the protection layer 210 may totally cover the intermediate metal layer 203 while exposing the solder bump 204. The protection layer 210 may be formed by a thermoplastic photosensitive resin, such as a composite comprising BCB (Benzo-Cyclo-Butene), polyimide and epoxy. In the packaging structure 200, it is not necessary to provide a multilayer coverage structure, for support, insulation and protection, on the back side of the chip 202. This is different from the prior art. In this way, the thickness of the packaging structure 200 may be reduced.

In order to reduce the thickness of the packaging structure 200, the back side of the chip 202 may be thinned by a chemical or mechanism thinning process. The thinning process may use the processes well known in the art, which are not repeated herein.

The substrate structure 201 includes a substrate 211 and a cavity wall 212 located on a side of the substrate 211 facing the optical sensor 205. The cavity wall 212 is formed in a wall-like closed-ring structure, and is configured to correspond to the optical sensor 205 on the chip 202 so that the area surrounded by the cavity wall 212 covers the optical sensor 205, but excludes the pad 206. The cavity wall 212 and the chip 202 sandwich the pad 206 located on the chip 202 therebetween. In the structure thus formed, the substrate 211 on the substrate structure 201, the cavity wall 212 and the chip 202 formed a cavity therebetween. The optical sensor 205 is sealed in the cavity. The cavity wall 212 may be made of epoxy.

Since the optical sensor 205, which is the target to be packaged, on the chip 202 needs to obtain optical signals through the substrate 211, it is necessary for the substrate 211 to be transparent in addition to its functions of providing insulation and support. For example, the substrate may be made of glass.

Figure 3:
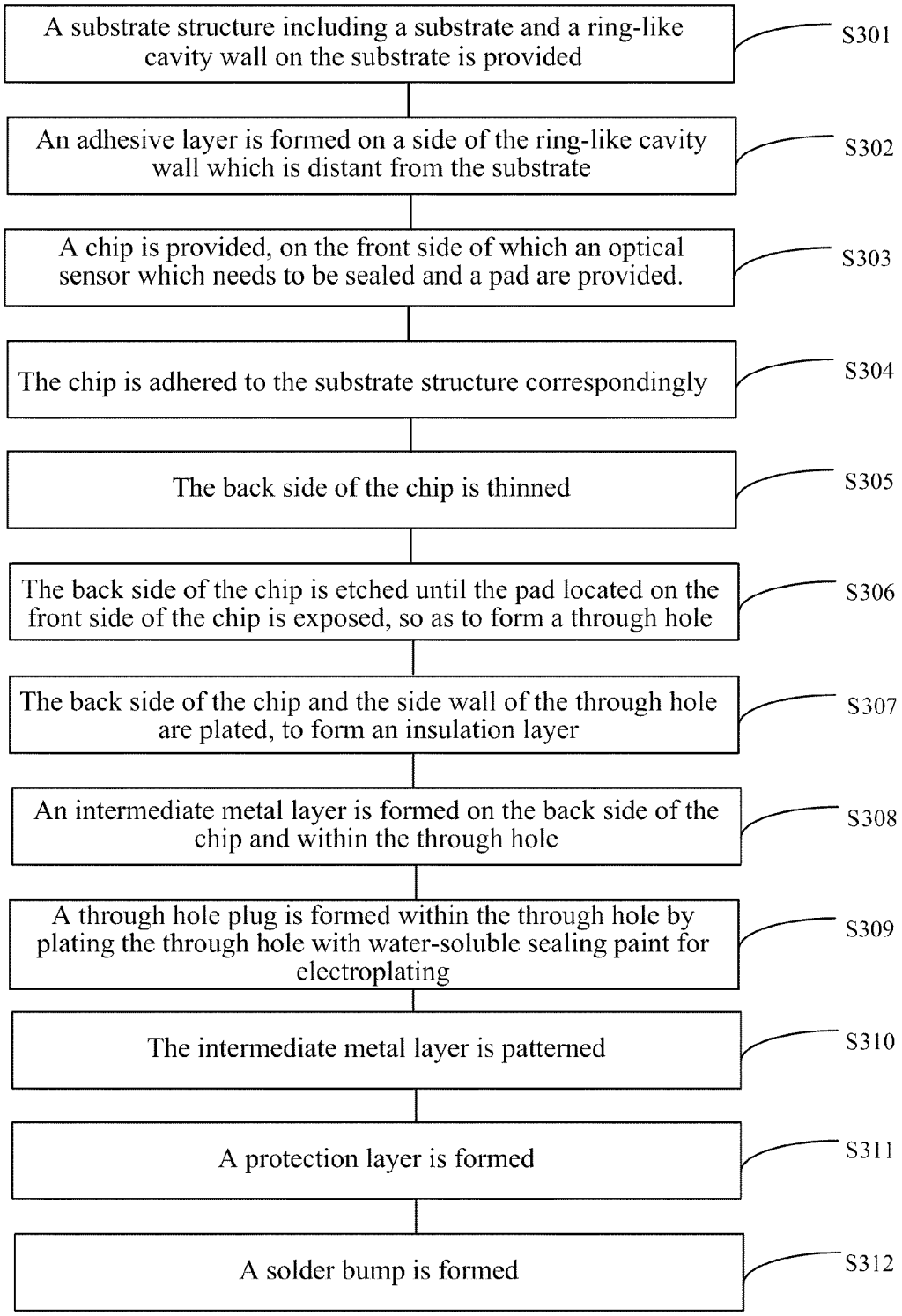
FIG. 3 is a flow chart illustrating a packaging process according to another embodiment of the application.

According to another aspect of the application, there is provided a method for forming the packaging structure. As shown in FIG. 3, the method according to an embodiment of the invention includes the following steps.

S301. A substrate structure including a substrate and a ring-like cavity wall on the substrate is provided.

S302. An adhesive layer is formed on a side of the ring-like cavity wall which is distant from the substrate.

S303. A chip is provided. On the front side of the chip, an optical sensor which needs to be sealed and a pad are provided.

S304. The chip is adhered to the substrate structure correspondingly.

S305. The back side of the chip is thinned.

S306. The back side of the chip is etched until the pad located on the front side of the chip is exposed, so as to form a through hole.

S307. The back side of the chip and the side wall of the through hole are plated, to form an insulation layer.

S308. An intermediate metal layer is formed on the back side of the chip and within the through hole.

S309. A through hole plug is formed within the through hole by plating the through hole with water-soluble sealing paint for electroplating.

S310. The intermediate metal layer is patterned.

S311. A protection layer is formed.

S312. A solder bump is formed.

FIGS. 4-11 are schematic diagrams illustrating a procedure for manufacturing the packaging structure using a packaging method according to an embodiment of the application. The packaging method is described below with reference to FIGS. 4-11.

Figure 4:
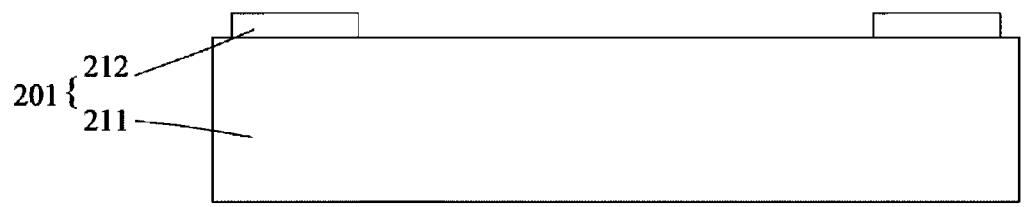
FIGS. 4-11 are schematic diagrams illustrating the flow of the packaging as shown in FIG. 3.

As shown in FIG. 4, step S301 is performed first during which a substrate structure 201 including a substrate 211 and a ring-like cavity wall 211 is provided. The structure of the substrate structure 201 is disclosed in the above description regarding the packaging structure 200 and will not be repeated herein.

Then, step S302 is performed during which an adhesive layer (not shown) is formed on a side of the ring-like cavity wall 212 which is distant from the substrate 211. The adhesive layer may serve for bonding, insulation and sealing, etc. The adhesive layer may be made of epoxy, polyimide, BCB (Benzo-Cyclo-Butene) resin or BT (B, Bismaleimide T, Triazine) resin.

Then, step S303 is performed during which a chip 202 is provided. On the front side of the chip 202, the optical sensor 205 which needs to be sealed and the pad 206 located in the exterior of the area enclosing the optical sensor 205 are provided. As described above, the pad 206 may connect the internal circuit of the chip 202 with the circuits outside the chip 202. The pad 206 may be an existing pad on the chip 202, no extra extension pads as disclosed in the prior art are formed. Therefore, the availability of the wafer may be increased significantly. In other words, more chips may be formed on a single wafer.

Figure 5:
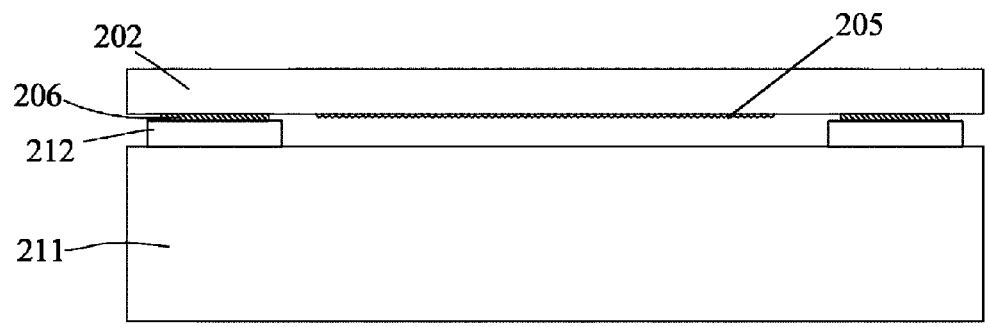

Next step S304 is performed during which the chip 202 is adhered to the substrate structure 201 correspondingly so that the substrate 211, the cavity wall 212 and the chip 202 form a cavity which seals the optical sensor 205 therein, while the pad 206 is sandwiched between the cavity wall 212 and the chip 202. Thus, the structure as shown in FIG. 5 is formed. The process of adhering the chip 202 to the substrate structure 201 correspondingly is substantively a process of adhering the whole wafer (not shown) to the substrate structure 201 having a size similar to the wafer, during which each of the chips 202 on the wafer corresponds to a corresponding one of the cavity walls 212 on the substrate structure 201. This is a process of wafer level packaging, by which the efficiency of packaging may be improved significantly.

Then step S305 is performed during which the back side of the chip 202 is thinned. The thinning process is well known in the art and will not be repeated herein.

Figure 6:
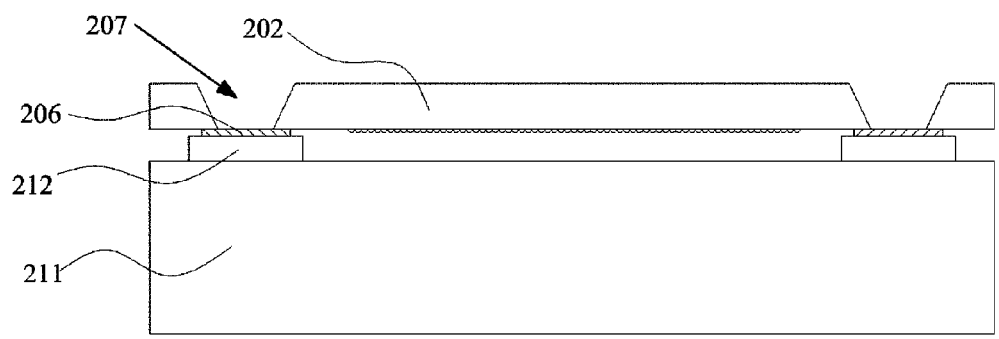

Then the step S306 is performed during which the back side of the chip 202 is etched until a pad 206 located on the front side of the chip 202 is exposed, so as to form a through hole 207, as shown in FIG. 6. Two methods for etching the chip 202 are described below. In the first method, a photoresist layer is spin-coated over the back side of the chip 202; an opening exposing the back side of the chip 202 is formed at a position on the photoresist layer corresponding to the pad 206 by using a photolithographic process; and then the back side of the chip 202 is plasma-etched with the photoresist layer as a mask by using a plasma dry etching process, until the pad 206 located on the front side of the chip 202 is exposed, and finally the photoresist layer is removed, thus the structure as shown in FIG. 6 is formed. In the second method, a dedicated mask layer is formed first on the back side of the chip 202, then a photoresist layer is spin-coated over the mask layer; an opening exposing the back side of the chip 202 is formed at a position on the photoresist layer corresponding to the pad 206 by using a through-hole photolithographic process; then the mask layer is plasma-etched with the photoresist layer as a mask by using a plasma dry etching process, until the back side of the chip 202 is exposed, and the photoresist layer is removed; then the back side of the chip 202 is plasma-etched with the mask layer as a mask by using a plasma dry etching process, until the pad 206 located on the front side of the chip 202 is exposed, and finally the mask layer is removed. The structure as shown in FIG. 6 can also be formed by the second method. The advantage of the second method lies in that a mask layer having a more appropriate etch ratio may be chosen so as to form a through hole 207 having a more desirable shape.

Generally the conductive pad 206 has to be insulated from the semiconductor silicon substrate of the chip 202. For example, the insulation may be formed by using a silicon oxide layer therebetween. In this case, in order to enable the electrical conductivity between the intermediate metal layer 203 and the pad 206, a portion of the silicon oxide layer at the position at which the intermediate metal layer 203 is connected to the pad 206 has to be removed in the subsequent processes. As can be seen, in the above embodiment of the invention, the step of plasma etching the chip 202 brings about an extra benefit, that is, a portion of the silicon oxide layer corresponding to the bottom of the through hole 207 is removed during this step. Accordingly, the electrical conductivity between the intermediate metal layer 203 and the pad 206 is enabled without any extra step for removing the silicon oxide layer. The insulation between the pad 206 and the semiconductor silicon substrate of the chip 202 is not affected by the removing of the portion of the silicon oxide layer corresponding to the bottom of the through hole 207.

Figure 7:
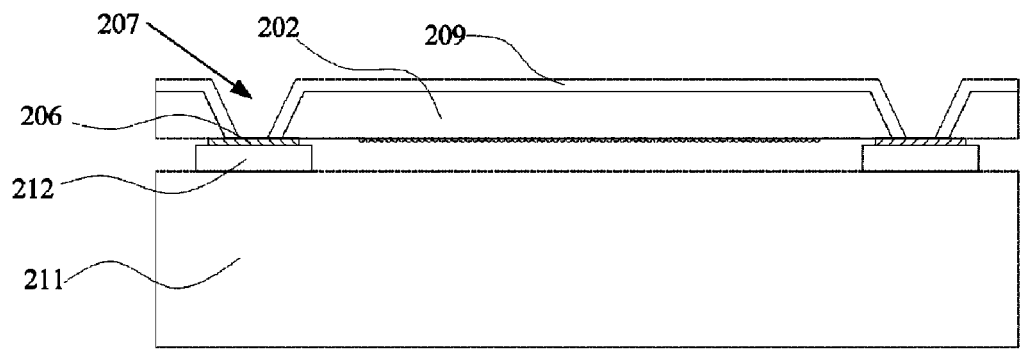

Then the step S307 is performed during which the back side of the chip 202 and the side wall of the through hole 207 are plated, to form an insulation layer 209. Thus, the structure as shown in FIG. 7 is formed. During the plating, only the semiconductor silicon substrate of the chip 202 is electrically conductive to a pole of the plating circuit. Thus, since the pad 206 is insulated from the semiconductor silicon substrate of the chip 202, the insulation layer 209 can not be formed on the pad 206 during the plating. That is, the insulation layer 209 is formed on only the back side of the chip 202 and the side wall of the through hole 207 via the plating.

Figure 8:
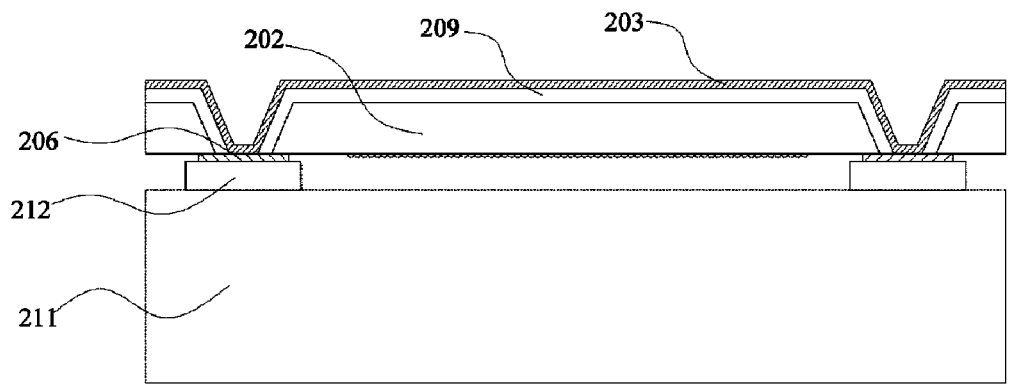

Then the step S308 is performed during which an intermediate metal layer 203 is formed on the back side of the chip 202 and within the through hole 207, as shown in FIG. 8. Thus, the intermediate metal layer 203 is connected directly to the pad 206 at the bottom of the through hole 207. The intermediate metal layer 203 may be deposited by a sputtering process, and may be formed by a metal such as aluminum, Al—Ni alloy or gold, or by Indium Tin Oxides (ITO).

Figure 9:
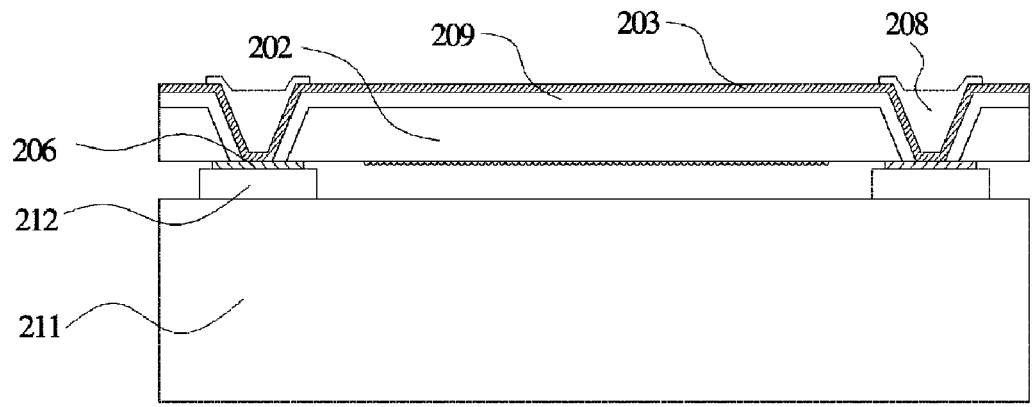

Then the step S309 is performed during which a through hole plug 208 is formed within the through hole 207 by plating the through hole 207 with water-soluble sealing paint for electroplating, as shown in FIG. 9. Particularly, the plating process may be as follows: first a mask which exposes only the through hole 207 is formed on the back side of the chip 202. For example, the mask may be formed with photoresist by using the methods in the description regarding the step S306, so as to improve the adaptability of the process; then the pad 206 is caused to be conductively connected to a pole of the plating circuit within the water-soluble sealing paint for electroplating, so that the through hole 207 is plated with the water-soluble sealing paint for electroplating to form the through hole plug 208 that seals the through hole 207. The plating method may prevent the formation of voids which are prone to occur when using other methods such as depositing. Thus, the stability of the packaging structure 200 may be improved.

Figure 10:
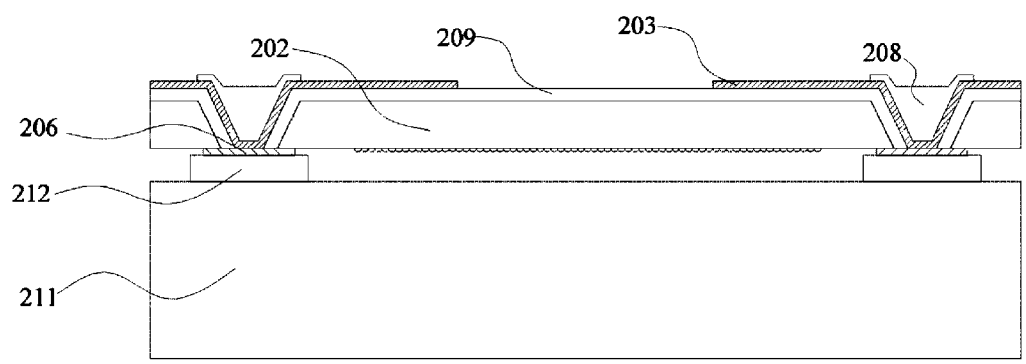

Then the step S310 is performed during which the intermediate metal layer 203 is patterned, forming the structure as shown in FIG. 10. As described above, there may be a plurality of pads 206 and corresponding solder bumps 204 in another embodiment. In this case, the intermediate metal layer 203 is required to be patterned to form an independent electrical signal path between each pad 206 and its corresponding solder bump 204. The patterning step S310 is to form a plurality of separated electrical signal paths in the intermediate metal layer 203.

Figure 11:
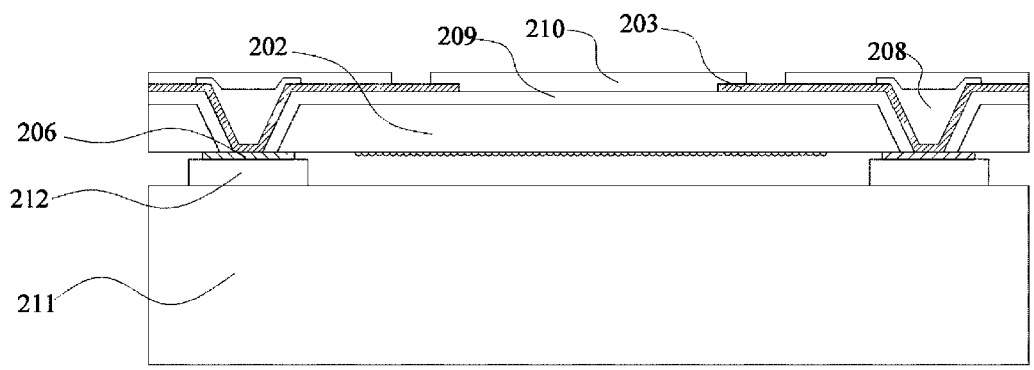

Then the step S311 is performed to form a protection layer 210 which covers the intermediate metal layer 203 and the through hole plug 208 and to pattern the protection layer 210 to form a through hole exposing the intermediate metal layer 203 at a position predefined for forming a solder bump 204, thus forming the structure as shown in FIG. 11.

Finally the step S311 is performed to form the solder bump 204 by a printing method. In this way, the structure as shown in FIG. 2 is formed. The printing method for forming the solder bump 204 is well known in the art and will not be repeated herein.

In the above embodiments, the optical sensor is used as an example of the packaging target. However, those skilled in the art can recognize that other types of chips may be used instead of the optical sensor, to implement the embodiments of the present invention.

Although the invention has been disclosed above with reference to some preferred embodiments thereof, but the invention should not be construed as limited thereto. Those skilled in the art can make any modifications and variations to the embodiments without departing from the spirit and scope of the application. Accordingly, the scope of the invention shall be defined by the following claims.

What is claimed is:

1. A packaging structure, comprising a solder bump, a pad located on a front side of a chip, and an intermediate metal layer which connects the solder bump and the pad, wherein a through hole passing from a back side of the chip to the pad is provided on the chip, and the intermediate metal layer is connected to the pad within the through hole; wherein the through hole is filled with water-soluble sealing paint for electroplating.

2. The packaging structure according to claim 1, wherein the water-soluble sealing paint for electroplating is formed by epoxide polymer or acrylic acid.

3. The packaging structure according to claim 1, wherein a protection layer is formed on a side of the chip which is distant from the intermediate metal layer.

4. The packaging structure according to claim 1, wherein the chip is an optical sensor chip.

5. The packaging structure according to claim 4, wherein the optical sensor chip is provided on the front side of the chip.

6. The packaging structure according to claim 1, wherein a circuit pattern is formed on the intermediate metal layer.

7. The packaging structure according to claim 1, wherein an insulation layer is provided between the intermediate metal layer and the chip.

8. The packaging structure according to claim 1, wherein the solder bump is provided on the back side of the chip.

* * * * *